United States Patent [19]

Pepper et al.

[11] Patent Number: 5,287,404
[45] Date of Patent: Feb. 15, 1994

[54] TELEPHONE SUBSCRIBER LINE VOLTAGE CHANGE DETECTION

[75] Inventors: David A. Pepper, Kemptville; Robert J. Miller, Lambeth; Richard J. Malyszka, Dorchester; Andre J. Robert, London, all of Canada

[73] Assignee: Northern Telecom Limited, Montreal, Canada

[21] Appl. No.: 631,255

[22] Filed: Dec. 20, 1990

[51] Int. Cl.$^5$ .................. H04M 3/22; H03K 5/24
[52] U.S. Cl. .................. 379/377; 307/358; 379/380; 379/382
[58] Field of Search ............ 379/377, 380, 381, 382, 379/383, 384, 385, 387, 188, 199, 393, 156, 162, 163; 307/360

[56] References Cited

U.S. PATENT DOCUMENTS

| 3,955,102 | 5/1976 | Chi .................. 307/360 X |
| 3,991,376 | 11/1976 | Stevens .................. 307/360 X |
| 4,132,864 | 1/1979 | Feng .................. 379/377 |
| 4,193,028 | 3/1980 | Downs, II .................. 307/360 |
| 4,319,092 | 3/1982 | Van der Enden et al. .................. 379/380 |
| 4,446,338 | 5/1984 | Rosch .................. 379/383 X |
| 4,540,853 | 9/1985 | Albouy .................. 379/382 X |
| 4,674,118 | 6/1987 | Tosto .................. 379/393 |
| 4,761,566 | 8/1988 | Inoue et al. .................. 307/360 X |
| 4,802,207 | 1/1989 | Uchida .................. 379/377 |
| 4,823,227 | 4/1989 | Grant .................. 307/360 |
| 4,859,872 | 8/1989 | Hyakutake .................. 307/360 X |
| 4,899,379 | 2/1990 | Vaclavik .................. 379/380 X |
| 4,939,471 | 7/1990 | Werrbach .................. 307/358 |
| 5,047,751 | 9/1991 | Miura et al. .................. 328/146 |
| 5,159,340 | 10/1992 | Smith .................. 307/358 |

FOREIGN PATENT DOCUMENTS 0145947  7/1986  Japan .................. 379/382

OTHER PUBLICATIONS

Radio Shack; Linear Applications vol. I; Nov. 1967; p. AN74-5.

Primary Examiner—James L. Dwyer
Assistant Examiner—M. Shehata
Attorney, Agent, or Firm—R. John Haley

[57]  ABSTRACT

Changes in a telephone subscriber line voltage are detected in a telephone set by supplying a voltage dependent upon the subscriber line voltage to a potential divider having first, second, and third tapping points, the second tapping point being between the first and third tapping points, and comparing the voltages at the first and third tapping points with a smoothed version of the voltage at the second tapping point to produce pulses at respective terminals when the line voltage is falling or rising. An algorithm is described for responding to the pulses to distinguish changes in hook state of another telephone connected to the same subscriber line from interfering signals. The arrangement facilitates remote release from hold and privacy indication functions for the telephone set.

25 Claims, 3 Drawing Sheets

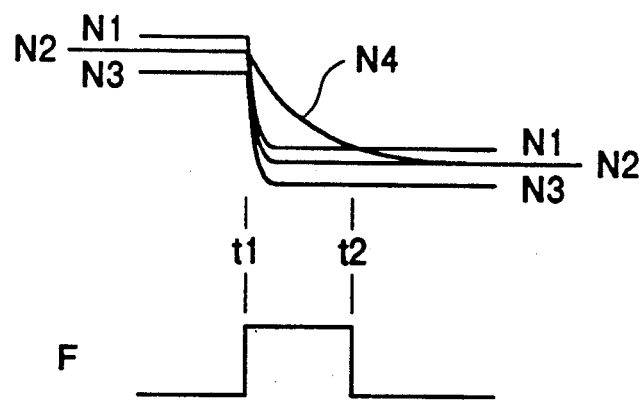
Fig. 4
Fig. 5
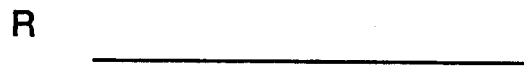
Fig. 6
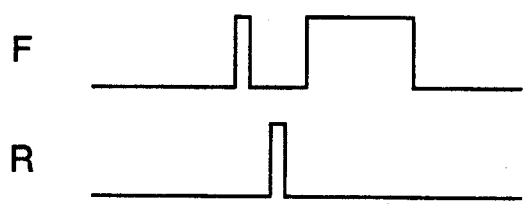
Fig. 7
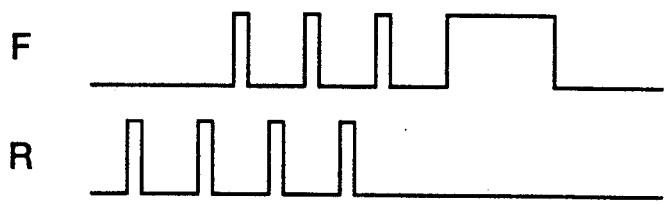
Fig. 8
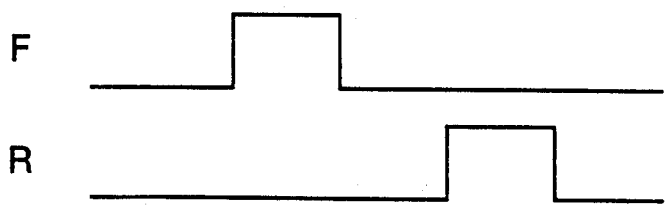

TELEPHONE SUBSCRIBER LINE VOLTAGE CHANGE DETECTION

This invention relates to the detection of voltage changes on a telephone subscriber line, and is particularly concerned with the detection of such voltage changes, at a first telephone set especially when it is off-hook, due to changes in the on-hook or off-hook state of another telephone set connected to the same subscriber line.

BACKGROUND OF THE INVENTION

It is well known to connect two or more telephone sets, for example in different rooms of a residence, to the same two-wire telephone subscriber line, thus enabling two or more people in the residence to participate simultaneously in a telephone conversation via the telephone subscriber line. A disadvantage of such an arrangement is that the privacy of a person using a first telephone set may be lost due to another person taking a second telephone set, connected to the same telephone subscriber line, off-hook (lifting the handset). While in some circumstances a click may be audible to the person using the first telephone set when the second telephone is taken off-hook, this does not provide a convenient or reliable indication that privacy has been interrupted. Accordingly, it is desirable to provide a more reliable indication at one telephone set of the hook state of another telephone set connected to the same line.

Such an indication is also useful even when the first telephone set is on-hook, as it can then serve to indicate to a prospective user of this telephone set whether or not the telephone subscriber line is already in use by another person using one of the other telephone sets connected to this line.

Furthermore, it is desirable for a user of the first telephone set to be able to place this in a hold state during a telephone call, to go to a second telephone set connected to the same line to continue the call, and to have the first telephone set automatically release itself from the hold state when the second telephone set is taken off-hook. This is referred to as remote release from hold.

For each of these situations, a change in the voltage between the two wires of the telephone subscriber line can conceivably be detected and used to take an appropriate action, for example to provide an indication at the first telephone set or to effect a release of this telephone set from the hold state. However, it has been found to be very difficult to monitor the subscriber line voltage in an effective manner to accomplish this, because of the variability of this voltage and the presence of interfering signals on the line.

More particularly, the actual subscriber line voltage is dependent upon a number of variable factors, such as the resistance of the telephone subscriber line and the number and nature of the telephone sets connected to the line. Interfering signals on the line can occur due to hook switch flashing or pulse dialling activities at other telephone sets connected to the line, and due to short-duration open switch intervals at the central office to which the subscriber line is connected. Open switch intervals comprise temporary interruptions in voltage supplied from the central office to the subscriber line during switching activity at the central office, and known methods of remote release from hold are susceptible to incorrectly releasing from hold in response to open switch intervals.

An object of this invention, therefore, is to provide an improved method of and apparatus for detecting voltage changes on a telephone subscriber line.

SUMMARY OF THE INVENTION

According to one aspect of this invention there is provided apparatus for detecting changes in a subscriber line voltage between two wires of a telephone subscriber line, comprising: a potential divider having first, second, and third tapping points, the second tapping point being between the first and third tapping points; means for supplying to the potential divider a voltage dependent upon the subscriber line voltage; a low pass filter circuit having an input connected to the second tapping point; a first voltage comparator, having inputs connected to the first tapping point and an output of the low pass filter circuit, for producing an output pulse in response to the subscriber line voltage falling; and a second voltage comparator, having inputs connected to the third tapping point and the output of the low pass filter circuit, for producing an output pulse in response to the subscriber line voltage rising.

The means for supplying a voltage dependent upon the subscriber line voltage preferably comprises means for attenuating audio frequency signals, so that audio frequency signals which occur on the telephone subscriber line in use do not interfere with the voltage comparisons.

It is convenient for the potential divider to comprise a first resistance between the first and second tapping points and a second resistance between the second and third tapping points, the first resistance being less than the second resistance so that a greater sensitivity is provided for falling than for rising subscriber line voltages.

According to another aspect this invention provides apparatus for detecting changes in a subscriber line voltage between two wires of a telephone subscriber line, comprising: means for attenuating audio frequency signals; a buffer coupled via the means for attenuating audio frequency signals to the subscriber line, the buffer having an output at which it produces, relative to a common rail, a voltage dependent upon the subscriber line voltage; a potential divider having first, second, and third tapping points, the potential divider comprising a first resistor between the output of the buffer and the first tapping point, a second resistor between the first and second tapping points, a third resistor between the second and third tapping points, and a fourth resistor between the third tapping point and the common rail; a smoothing circuit having an input connected to the second tapping point; a first voltage comparator, having inputs connected to the first tapping point and an output of the smoothing circuit, for producing an output pulse in response to the subscriber line voltage falling; and a second voltage comparator, having inputs connected to the third tapping point and the output of the smoothing circuit, for producing an output pulse in response to the subscriber line voltage rising.

Conveniently each of the means for attenuating audio frequency signals and the smoothing circuit comprises a resistance and a capacitance whose product defines a respective time constant, and the time constant of the smoothing circuit is of the order of ten times the time constant of the means for attenuating audio frequency signals.

In accordance with a further aspect of this invention there is provided a method of detecting, at a first telephone set connected to a two-wire telephone subscriber line, a change from an on-hook state to an off-hook state of a second telephone set connected to the same subscriber line, comprising the steps of: monitoring a subscriber line voltage between the two wires of the subscriber line; producing a pulse at a first circuit terminal in response to the subscriber line voltage falling; producing a pulse at a second circuit terminal in response to the subscriber line voltage rising; in response to a pulse at the first terminal having at least a predetermined duration, starting a window timer period; detecting any pulse at the second terminal during the window timer period and, in the absence of such a pulse and in the absence of an action at the first telephone set causing the subscriber line voltage to fall, determining that the second telephone set is in an off-hook state.

According to another aspect this invention provides a method of detecting, at a first telephone set connected to a two-wire telephone subscriber line, hook state changes of a second telephone set connected to the same subscriber line, comprising the steps of:

(i) monitoring a subscriber line voltage between the two wires of the subscriber line;

(ii) producing a pulse at a first terminal in response to the subscriber line voltage falling;

(iii) producing a pulse at a second terminal in response to the subscriber line voltage rising;

(iv) detecting a first pulse at either of the first and second terminals and noting at which terminal such a first pulse is produced;

(v) determining whether the pulse has at least a predetermined duration, if so proceeding to step (ix) and if not proceeding to step (vi);

(vi) detecting any pulse at either terminal starting within a predetermined cancellation period, in the absence of any pulse returning to step (iv) and in response to such a pulse proceeding to step (vii);

(vii) determining whether the most recent pulse has at least a predetermined duration, if so proceeding to step (viii) and if not returning to step (vi);

(viii) determining whether the most recent pulse is at the same terminal as that noted in step (iv) at which the first pulse was produced, if so proceeding to step (ix) and if not returning to step (iv);

(ix) detecting any pulse, at the other terminal than that noted in step (iv) at which the first pulse was produced, starting within a predetermined window period, in the absence of any pulse proceeding to step (x) and in the presence of such a pulse returning to step (iv);

(x) in the absence of any action at the first telephone set to cause the first pulse detected in step (iv), determining that the second telephone set is off-hook if the first pulse was produced at the first terminal, and determining that the second telephone set is on-hook if the first pulse was at the second terminal; and (xi) returning to step (iv).

Although none of the times is particularly critical, the predetermined duration in each of steps (v) and (vii) is preferably at least about 10 ms, and desirably is at least about 60 ms. In the embodiments of the invention described below this period is 106 ms, but it can conceivably be anywhere in a range from about 10 ms to about 400 ms. The predetermined cancellation period in step (vi) is conveniently of the order of 1.2 seconds, and the predetermined window period in step (ix) is conveniently of the order of 600 ms, but again these periods are not critical and may be varied to suit particular circumstances.

Preferably steps (i) to (iii) of the above method comprise the steps of: deriving from the subscriber line voltage first, second, and third comparison voltages, the second comparison voltage being produced by smoothing a voltage between the first and third comparison voltages; and comparing the first and third comparison voltages with the second comparison voltage to produce the pulses at the first and second terminals respectively.

The second comparison voltage is conveniently produced by integrating a voltage between the first and third comparison voltages with an integration time constant of the order of 200 ms. It should be appreciated that such integration is the same as a low pass filtering or smoothing as recited above.

BRIEF DESCRIPTION OF THE DRAWINGS

The invention will be further understood from the following description with reference to the accompanying drawings, in which similar references are used in different figures to denote similar components and in which:

FIGS. 4 to 8 are signal diagrams with reference to which the operation of the apparatus and the processing of the signals are explained.

DESCRIPTION OF THE PREFERRED EMBODIMENTS

Figure 1:
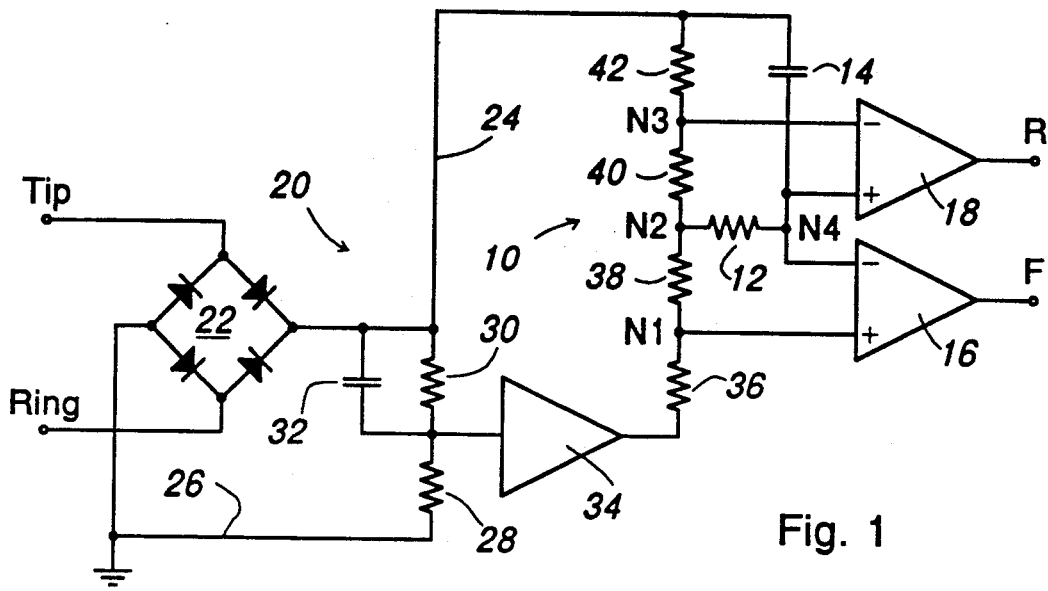
FIGS. 1 and 2 are circuit diagrams illustrating alternative forms of apparatus, in accordance with embodiments of the invention, for detecting changes in voltage between the two wires of a telephone subscriber line.

Referring to FIG. 1, there is illustrated a first form of a subscriber line voltage change detector in accordance with a preferred embodiment of the invention. The detector comprises a potential divider 10, a low pass filter circuit constituted by a series resistor 12 and a shunt capacitor 14, two voltage comparators 16 and 18, and circuitry 20 for supplying to the potential divider 10 a voltage dependent upon the voltage between the tip and ring wires of a two-wire telephone subscriber line (not shown).

The circuitry 20 includes a diode bridge 22 having an a.c. input connected to input terminals referenced Tip and Ring, which are coupled to the two wires of the telephone subscriber line as described further below, and a d.c. output. A positive terminal of the d.c. output of the diode bridge is connected to a line 24, which constitutes a common rail in the apparatus of FIG. 1, and a negative terminal is connected to a grounded line 26. The circuitry 20 also includes a potential divider comprising resistors 28 and 30 connected between the lines 24 and 26, with a capacitor 32 connected in parallel with the resistor 30 between the common rail or line 24 and the junction between the resistors 28 and 30. In addition, the circuitry 20 includes a buffer 34 having an input connected to the junction between the resistors 28 and 30. The potential divider 10 is connected between the output of the buffer 34 and the common rail 24.

The apparatus of FIG. 1 forms part of a telephone set, the remainder of which is not shown and can be of generally known form, which is connected to the telephone subscriber line. The diode bridge 20 may be a diode bridge which is already provided for telephone polarity guard purposes. The Tip and Ring terminals shown in FIG. 1 are connected to the tip and ring wires, respectively, of the telephone subscriber line. They can be connected on either side of the hook switch of the telephone set, i.e. either on the central office side of the hook switch so that they are always connected to the subscriber line regardless of whether or not the telephone is off-hook, or on the voice circuit (terminal) side of the hook switch so that they are connected to the line via the hook switch. In the latter case, the apparatus of FIG. 1 is only responsive to subscriber line voltage changes when the telephone is off-hook (the hook switch is closed), but in this case the resistors 28 and 30 can have moderate resistances because they do not continuously load the subscriber line. In the former case, which is preferred and is assumed throughout the following description, the apparatus is responsive to subscriber line voltage changes regardless of whether or not the telephone is off-hook. In this case the resistors 28 and 30 continuously load the subscriber line and therefore have very high resistances, and the buffer 34 also has a very high input impedance.

By way of example, the resistors 28 and 30 can have resistances of 47 MΩ and 16 MΩ respectively. The capacitor 32, which can have a capacitance of 2.2 nF, serves to attenuate audio frequency signals at the input of the buffer 34 without unduly attenuating longer duration voltage changes which are to be detected. In this example the capacitor 32 forms with the resistors 28 and 30 (which the capacitor sees in parallel combination as a resistance of about 12 MΩ) a smoothing (or low pass filter or integrating) circuit with a time constant of the order of 26 ms. The buffer 34 serves to isolate the potential divider 10 from the subscriber line.

The potential divider 10 comprises four resistors 36, 38, 40, and 42 connected in series, thus providing three tapping points or nodes which are referenced N1, N2, and N3. The node N1 is between the resistor 36, connected to the output of the buffer 34, and the resistor 38; the node N2 is between the resistors 38 and 40; and the node N3 is between the resistors 40 and 42, the resistor 42 being connected to the common rail 24. The low pass filter circuit comprising the components 12 and 14 has an input connected to the node N2 and an output constituting a node N4; thus the series resistor 12 is connected between the nodes N2 and N4, and the shunt capacitor 14 is connected between the node N4 and the common rail 24. The low pass filter circuit serves as described further below to smooth the voltage at the node N4 relative to that at the node N2.

By way of example, the potential divider resistors 36, 38, 40, and 42 can have resistances of respectively 10 kΩ, 500 Ω, 750 Ω, and 10 kΩ; the resistor 12 can have a resistance of 100 kΩ and the capacitor 14 can have a capacitance of 2.2 μF. The low pass filter circuit (which can alternatively be considered as a smoothing or integrating circuit) has a time constant determined by the product of the resistance of the resistor 12 with the capacitance of the capacitor 14, and in this case is 220 ms. This is of the order of 200 ms, or of the order of ten times the time constant of the audio frequency attenuating components 28, 30, and 32.

The comparator 16 has a non-inverting (+) input connected to the node N1, an inverting (−) input connected to the node N4, and an output connected to a circuit terminal F at which as described further below it provides a pulse in response to a fall in the subscriber line voltage. Conversely, the comparator 18 has a non-inverting (+) input connected to the node N4, an inverting (−) input connected to the node N3, and an output connected to a circuit terminal R at which as described further below it provides a pulse in response to a rise in the subscriber line voltage. In each case the duration of each output pulse is dependent upon the magnitude of the subscriber line voltage change and its timing relative to, and the timing and magnitude of, previous subscriber line voltage changes. Although not shown in FIG. 1, additional circuitry (e.g. positive feedback or current sources switched by the comparator outputs) may be provided for each comparator to implement hysteresis to prevent oscillation or spurious outputs from the comparators at the switching thresholds.

Figure 2:
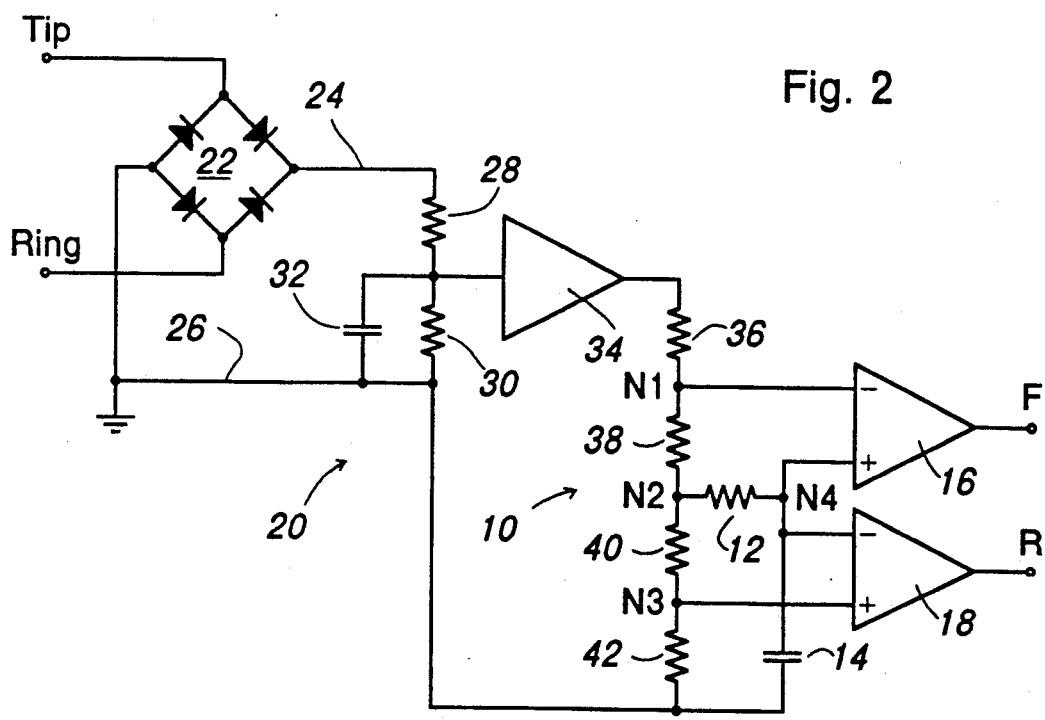

The apparatus of FIG. 2 is similar to that of FIG. 1 and operates in a corresponding manner, except that the common rail to which the potential divider 10 is connected is constituted by the grounded line 26 rather than the line 24, and consequently the connections of the inverting and non-inverting inputs of each comparator are interchanged (e.g. for the comparator 16, the inverting (−) input is connected to the node N1 and the non-inverting (+) input is connected to the node N4). As it is more usual to think of a common rail as being grounded as in FIG. 2, the following description relates to this arrangement rather than that of FIG. 1. However, it should be appreciated that the two arrangements are interchangeable and equivalent.

In addition to the apparatus of FIGS. 1 or 2, the telephone set includes a control microprocessor (not shown) which, in addition to performing conventional functions such as controlling the storage, retrieval, and display of dialled numbers, serves to monitor the pulses which are produced at the terminals F and R and to take appropriate consequential actions, such as controlling an indicator to indicate that another telephone set connected to the same subscriber line is off-hook, and controlling remote release of a hold state of this telephone set. To this end, the microprocessor carries out, in a time sharing manner with its other functions, an algorithm which is represented in the flow chart of FIG. 3.

Figure 3:
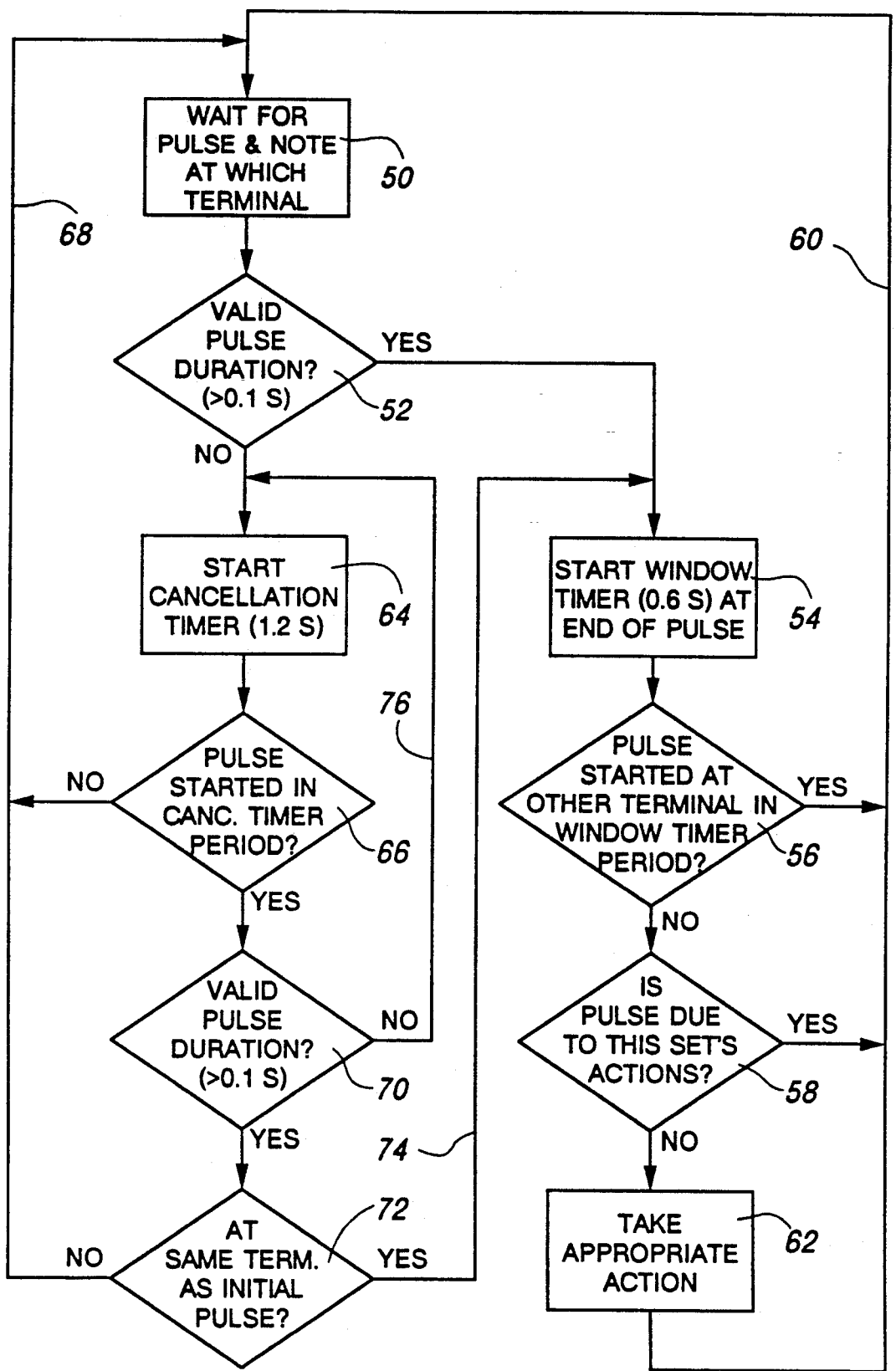
FIG. 3 is a flow chart illustrating the processing, in accordance with an embodiment of the invention, of signals produced by the apparatus of FIG. 1 or 2.

Before describing the flow chart of FIG. 3 in detail, reference is also made to FIG. 4, which illustrates by way of example signals which may occur in operation of the apparatus of FIG. 2 when the subscriber line voltage, between the two wires of the telephone subscriber line, falls, for example as a result of another telephone set connected to the same subscriber line being taken off-hook. The upper part of FIG. 4 represents the voltages of the nodes N1 to N4 as a function of time; the lower parts of FIG. 4 represent the resulting signals at the terminals F and R, which signals are accordingly denoted by the same references F and R respectively.

Initially, assuming a static situation, as shown at the left-hand side of FIG. 4 the voltage of the node N4 is the same as that of the node N2 and lies between the voltages of the nodes N1 and N3, and the outputs of the comparators 16 and 18 are both low. Because the resistor 38 has a smaller resistance than the resistor 40, the voltage of the node N2 is closer to that of the node N1 than that of the node N3, as can be seen in FIG. 4. This difference makes the arrangement more sensitive to a fall in the subscriber line voltage, as occurs in the event of loss of privacy and remote release from hold, than a rise in the subscriber line voltage, but if desired equal sensitivity can be provided by making the resistances of the resistors 38 and 40 equal.

At a time t1 in FIG. 4, it is assumed that the subscriber line voltage falls due to another telephone connected to the line being taken off-hook. The voltages of the nodes N1, N2, and N3 all fall in a corresponding manner, relatively quickly and slowed only by the effect of the capacitor 32, to lower levels as represented at the right-hand side of FIG. 4. The voltage of the node N4, due to the smoothing effect and time constant of the low pass filter circuit constituted by the components 12 and 14, falls exponentially and more slowly from the original voltage of the node N2 to the final voltage of the node N2. Consequently, from the time t1 until a time t2, the node N4 is more positive than the node N1, with the result that during this time period the comparator 16 produces a pulse of the signal F, i.e. a pulse indicating that the subscriber line voltage has fallen. The output of the comparator 18, as represented by the signal R, remains low because the node N4 stays more positive than the node N3.

As represented by a box 50 in FIG. 3, the microprocessor waits for a pulse to occur at either of the terminals F and R, and on the occurrence of a pulse records whether it is at the terminal F or the terminal R. It then determines, as represented by a decision box 52, whether or not the pulse has a valid duration. In this embodiment a pulse with a duration greater than about 0.1 second (actually 106 ms, selected in view of the time sharing of the microprocessor), is considered to be valid, and a pulse of lesser duration is considered to be invalid.

Assuming that the pulse has a valid duration (i.e. t2−t1>106 ms), then at the end of the pulse (i.e. at the time t2) the microprocessor starts a 600 ms window timer at a box 54 and checks in a decision box 56 whether a pulse starts at the other terminal during this window period. This is discussed further below with reference to FIG. 8. Assuming that no other pulse occurs during this window period, then a decision box 58 is reached in which it is determined whether or not the pulse which has been detected is a result of actions which have been taken at this particular telephone set. If the answer to this decision is yes (for example the pulse at the terminal F is due to this set being taken off-hook), then no action is necessary from this algorithm and a return is made to the box 50 via a line 60 in FIG. 3. If, however, the answer to this decision in the box 58 is no, then it is concluded that the pulse is due to a change in the hook state of another telephone set connected to the same telephone subscriber line. In other words, it is determined that this other telephone set is now in an off-hook state if the pulse was at the terminal F, and that this other telephone set is now in an on-hook state if the pulse was at the terminal R. In this case appropriate action is taken at a box 62, and again a return is made to the initial box 50.

The action represented by the box 62 may be any of a number of possible actions, depending on the state of this telephone set, the terminal at which the pulse occurs, and the previous conditions recognized by the microprocessor. For example, if the pulse is at the terminal F as represented in FIG. 4, then the microprocessor concludes that another telephone set connected to the same subscriber line has been taken off-hook. If this telephone set (i.e. the telephone set containing the microprocessor) is on-hook, the action may be to provide an indication that the telephone subscriber line is in use. If this telephone set is on hold, then the action may be to release this set from the hold state, on the understanding that a telephone call is being continued from another set (remote release from hold). If this set is off-hook but not on hold, the action may be to provide an indication that another telephone set has been taken off-hook and that privacy has been lost. Conversely, if the pulse were at the terminal R instead of the terminal F, the action may be to terminate a previous indication that the subscriber line is in use or that privacy has been lost.

The other boxes and parts of the flow chart of FIG. 3 serve for distinguishing against various pulses which may occur at one or both of the terminals F and R due to various interfering signals such as those which have already been mentioned. These are discussed further below with additional reference to the diagrams in FIGS. 5 to 8. These diagrams are provided for explanation and by way of example only, to illustrate the types of signals which may occur in operation. In each of these diagrams, the signals F and R are represented in a similar manner to the representation of these signals in FIG. 4, and for simplicity the corresponding node voltages are not illustrated. In these diagrams, also for simplicity, pulses are illustrated all with either a fixed short duration (narrow pulses) or a fixed longer duration (wide pulses). It should be appreciated that the narrow pulses represent pulses with arbitrary and various invalid durations less than 106 ms, and the wide pulses represent pulses with arbitrary and various valid durations greater than 106 ms. In addition, the intervals between pulses shown in the diagrams of FIGS. 5 to 8 may vary widely.

As has already been indicated, the duration of 106 ms for a valid pulse is not critical, and is selected in this embodiment of the invention as being about 100 ms in view of component values of the apparatus of FIGS. 1 and 2, and specifically 106 ms to match timing characteristics of the microprocessor and other functions which it performs. A shorter or longer validation duration may be used, possibly as little as 10 ms or as much as 400 ms, but it is preferably at least 60 ms in view of pulse dialling timing considerations.

In FIG. 5, the signal F has two consecutive pulses, the first having an invalid duration and the second a valid duration. Such a pulse sequence may occur when a telephone set is taken off-hook, because the hook switch is usually a mechanical switch which is subject to intermittent contact on being closed. In the flow chart of FIG. 3, in this case the first pulse is detected at the box 50 and it is decided at the box 52 that its duration is invalid. Consequently, as represented by a box 64 a cancellation timer, having a time period of 1.2 seconds, is started, and it is determined at a decision box 66 whether or not another pulse, at either terminal F or R, starts within this cancellation time period. If not, then it is assumed that the invalid duration pulse is an erroneous pulse, and its detection is effectively cancelled by a return being made to the box 50 via a line 68.

If, as is assumed in the case of FIG. 5, another pulse starts within the 1.2 second cancellation timer period, then a decision box 70 is reached in which it is determined whether or not this new pulse has a valid duration, the criterion for this being the same as at the box 52. If the duration of this pulse is valid, then a decision box 72 is reached in which it is determined whether or not this pulse is at the same terminal (F or R) as the pulse which was initially detected at the box 50. In the case of FIG. 5 the answer to this decision is yes, and consequently a branch is taken via a line 74 to the box 54, and the same sequence as described above is followed in this and subsequent boxes.

In FIG. 6, the signal F has two consecutive pulses, the first having an invalid duration and the second a valid duration, and between these pulses a pulse having an invalid duration also occurs at the other terminal R. Such a pulse sequence may occur when a telephone set is taken off-hook and there is a mechanical switch bounce. In the flow chart of FIG. 3, in this case the same sequence as described above for FIG. 5 is followed until the decision box 70 is reached. Now in the box 70 it is determined that the new pulse at the terminal R has an invalid duration, and a return is made via a line 76 to the box 64, the cancellation timer being restarted at the end of the pulse at the terminal R. In the subsequent decision boxes 66, 70, and 72 the valid duration pulse at the terminal F is respectively detected, validated, and determined to be at the same terminal (F) as the original pulse detected at the box 50, so that a branch is made to box 54 via the line 74 as described above.

In FIG. 7, both of the signals F and R have an arbitrary number of pulses each of invalid duration, each following the immediately preceding pulse within the cancellation timer period, with a final pulse of valid duration at the opposite terminal to that at which the first pulse occurred. In FIG. 7 the first pulse occurs at the terminal R and the final, valid duration, pulse occurs at the terminal F. This is typical of a sequence of pulses generated when a pulse dialling telephone, which has previously been taken off-hook (this having been detected as described above) is dialled. In this case, as in the case of FIG. 6 each invalid duration pulse results in a return via the line 76 to restart the cancellation timer and to wait for a valid duration pulse starting within the cancellation time period. The final pulse at the terminal F is a valid duration pulse, and results in the decision box 72 being reached. In this case the valid duration pulse (at the terminal F) is not at the same terminal as the initial pulse (at the terminal R) detected at the box 50, and accordingly a return is made via the line 68 to the box 50 and no action is taken.

In FIG. 8, a valid duration pulse occurs at the terminal F, and after a delay a pulse (which is shown as a valid duration pulse but need not be) occurs at the terminal R. This is typical of an open switch interval, in which power to the subscriber line is momentarily removed during a switching operation, causing the subscriber line voltage to fall and subsequently to rise. In this case the initial valid duration pulse at the terminal F results in the decision box 56 being reached as described above in relation to FIG. 4. As the window timer period of 600 ms is selected to be greater than the delay between the end of the first pulse and the start of the second pulse, in this case the answer at the decision box 56 is yes, and as a result a return is made to the box 50 via the line 60 without any other action being taken. Thus an erroneous remote release from hold due to the open switch interval is avoided.

From the above description, it can be seen that the algorithm which the microprocessor follows, corresponding to the flow chart of FIG. 3, enables significant subscriber line voltage changes to be detected and responded to, without being adversely affected by interfering signals due to hook switch bounce or flashing, pulse dialling, and open switch intervals. Thus with reference to the pulse sequences in FIGS. 4 to 6, in each case the valid duration pulse of the signal F is correctly determined to represent a fall in the subscriber line voltage, regardless of the presence of preceding invalid duration pulses of the signals F and R. With reference to FIG. 7, the pulse sequence shown therein, corresponding to pulse dialling at another telephone set, does not result in any erroneous determination of a change in the hook state of that telephone set, because the valid duration final pulse is at the other terminal than that at which the first pulse is detected. In addition, an open switch interval, producing pulses such as shown in FIG. 8, also does not result in any erroneous determination of a change in the hook state of another telephone set.

It should also be appreciated from the circuit diagrams in FIGS. 1 and 2 and the diagram in FIG. 4 that the voltage at the node N4 is automatically positioned, when the subscriber line voltage is not changing, at a desired position between the voltages at the nodes N1 and N3. This self-adjusting (self-centering if the resistors 38 and 40 have the same resistance) property of the apparatus enables the apparatus to operate effectively with relatively arbitrary absolute values of subscriber line voltage, and hence arbitrary subscriber line resistances and numbers and types of telephone sets connected to the subscriber line.

It should be recognized, however, that the arrangements described above do not necessarily respond to every situation in which there is a change in the hook state of another telephone set connected to the same subscriber line. In particular, if the other telephone set's hook state changes at substantially the same time as a change in the hook state of the telephone set containing the microprocessor and the apparatus of FIG. 1 or 2, this will not be recognized by the arrangement described above. Thus the above arrangement provides a useful, rather than an absolutely reliable, indication of the hook state of the other telephone set. It should be appreciated that the usefulness of this indication can be enhanced by modifying the above arrangement to monitor different durations of valid duration pulses and to respond accordingly; such modification may facilitate the recognition of simultaneous hook state changes at more than one telephone set.

Furthermore, the above description relates only to the existence of one other telephone set connected to the subscriber line, whereas in practice several other telephone sets may be so connected and the hook state of each of these may be independently changed. Obviously, the microprocessor may be arranged to track simultaneously the hook state of a plurality of other telephone sets connected to the same subscriber line, and again in this case pulse durations may be monitored to assist in this tracking.

Numerous other modifications, variations, and adaptations may be made to the described embodiments without departing from the scope of the invention as defined in the claims.

What is claimed is:

1. Apparatus for detecting changes in a subscriber line voltage between two wires of a telephone subscriber line, comprising:
   a potential divider having first, second, and third tapping points, the second tapping point being between the first and third tapping points;
   means for supplying to the potential divider a voltage dependent upon the subscriber line voltage;

a low pass filter circuit having an input connected to the second tapping point;

a first voltage comparator, having inputs connected to the first tapping point and an output of the low pass filter circuit, for producing an output pulse in response to a fall in the subscriber line voltage; and a second voltage comparator, having inputs connected to the third tapping point and the output of the low pass filter circuit, for producing an output pulse in response to a rise in the subscriber line voltage.

2. Apparatus as claimed in claim 1 wherein the means for supplying a voltage dependent upon the subscriber line voltage comprises a buffer having an input coupled to the telephone subscriber line and an output connected to the potential divider.

3. Apparatus as claimed in claim 2 wherein the means for supplying a voltage dependent upon the subscriber line voltage further comprises two resistances forming a second potential divider coupled to the telephone subscriber line, the input of the buffer being connected to a junction between the two resistances.

4. Apparatus as claimed in claim 3 wherein the means for supplying a voltage dependent upon the subscriber line voltage further comprises a capacitor connected in parallel with one of the two resistances for attenuating audio frequency signals.

5. Apparatus as claimed in claim 3 wherein the means for supplying a voltage dependent upon the subscriber line voltage further comprises a diode bridge via which the two resistances forming the second potential divider are coupled to the telephone subscriber line.

6. Apparatus as claimed in claim 1 wherein the means for supplying a voltage dependent upon the subscriber line voltage comprises means for attenuating audio frequency signals.

7. Apparatus as claimed in claim 1 wherein the low pass filter circuit comprises a series resistor connected between the input and the output of the filter circuit, and a shunt capacitor connected between the output of the filter circuit and a common rail.

8. Apparatus as claimed in claim 7 wherein the product of the resistance of the series resistor and the capacitance of the shunt capacitor of the filter circuit correspond to a time constant of the order of 200 ms.

9. Apparatus as claimed in claim 1 wherein the potential divider comprises a first resistance between the first and second tapping points and a second resistance between the second and third tapping points, the first resistance being less than the second resistance.

10. Apparatus for detecting changes in a subscriber line voltage between two wires of a telephone subscriber line, comprising:

means for attenuating audio frequency signals;

a buffer coupled via the means for attenuating audio frequency signals to the subscriber line, the buffer having an output at which it produces, relative to a common rail, a voltage dependent upon the subscriber line voltage;

a potential divider having first, second, and third tapping points, the potential divider comprising a first resistor between the output of the buffer and the first tapping point, a second resistor between the first and second tapping points, a third resistor between the second and third tapping points, and a fourth resistor between the third tapping point and the common rail;

a smoothing circuit having an input connected to the second tapping point;

a first voltage comparator, having inputs connected to the first tapping point and an output of the smoothing circuit, for producing an output pulse in response to a fall in the subscriber line voltage; and a second voltage comparator, having inputs connected to the third tapping point and the output of the smoothing circuit, for producing an output pulse in response to a rise in the subscriber line voltage.

11. Apparatus as claimed in claim 10 wherein the means for attenuating audio frequency signals comprises a resistance and a capacitance whose product defines a first time constant, and wherein the smoothing circuit comprises a resistance and a capacitance whose product defines a second time constant which is of the order of ten times the first time constant.

12. A method of detecting, at a first telephone set connected to a two-wire telephone subscriber line, a change from an on-hook state to an off-hook state of a second telephone set connected to the same subscriber line, comprising the steps of:

(i) monitoring a subscriber line voltage between the two wires of the subscriber line;

(ii) producing a pulse at a first circuit terminal in response to a fall in the subscriber line voltage;

(iii) producing a pulse at a second circuit terminal in response to a rise in the subscriber line voltage;

(iv) in response to a pulse at the first terminal having at least a predetermined duration, starting a window timer period;

(v) detecting any pulse at the second terminal during the window timer period and, in the absence of a pulse and in the absence of an action at the first telephone set causing the subscriber line voltage to fall, determining that the second telephone set is in an off-hook state.

13. A method as claimed in claim 12 wherein the window timer period is of the order of 600 ms.

14. A method as claimed in claim 12 wherein the predetermined duration is at least about 60 ms.

15. A method as claimed in claim 12 wherein steps (i) to (iii) comprise the steps of:

deriving from the subscriber line voltage first, second, and third comparison voltages, the second comparison voltage being produced by smoothing a voltage between the first and third comparison voltages; and comparing the first and third comparison voltages with the second comparison voltage to produce the pulses at the first and second terminals respectively.

16. A method as claimed in claim 15 wherein the second comparison voltage is produced by integrating a voltage between the first and third comparison voltages with an integration time constant of the order of 200 ms.

17. A method as claimed in claim 15 wherein the step of deriving the first, second, and third comparison voltages from the subscriber line voltage comprises attenuating audio frequency signals.

18. A method of detecting, at a first telephone set connected to a two-wire telephone subscriber line, hook state changes of a second telephone set connected to the same subscriber line, comprising the steps of:

(i) monitoring a subscriber line voltage between the two wires of the subscriber line;

(ii) producing a pulse at a first terminal in response to a fall in the subscriber line voltage;

(iii) producing a pulse at a second terminal in response to a rise in the subscriber line voltage;

(iv) detecting a first pulse at either of the first and the second terminals and noting at which terminal such a first pulse is produced;

(v) determining whether the pulse has at least a predetermined duration, if so proceeding to step (ix) and if not proceeding to step (vi);

(vi) detecting any pulse at either terminal starting within a predetermined cancellation period, in the absence of a pulse returning to step (iv) and in response to a pulse proceeding to step (vii);

(vii) determining whether the most recent pulse has at least a predetermined duration, if so proceeding to step (viii) and if not returning to step (vi);

(viii) determining whether the most recent pulse is at the terminal noted in step (iv) at which the first pulse was produced, if so proceeding to step (ix) and if not returning to step (iv);

(ix) detecting any pulse, at the other terminal than that noted in step (iv) at which the first pulse was produced, starting within a predetermined window period, in the absence of a pulse proceeding to step (x) and in the presence of a pulse returning to step (iv);

(x) in the absence of any action at the first telephone set to cause the first pulse detected in step (iv), determining that the second telephone set is off-hook if the first pulse was produced at the first terminal, and determining that the second telephone set is on-hook if the first pulse was at the second terminal; and (xi) returning to step (iv).

19. A method as claimed in claim 18 wherein the predetermined duration in each of steps (v) and (vii) is at least about 10 ms.

20. A method as claimed in claim 18 wherein the predetermined duration in each of steps (v) and (vii) is at least about 60 ms.

21. A method as claimed in claim 18 wherein the predetermined cancellation period in step (vi) is of the order of 1.2 seconds.

22. A method as claimed in claim 18 wherein the predetermined window period in step (ix) is of the order of 600 ms.

23. A method as claimed in claim 18 wherein steps (i) to (iii) comprise the steps of:

deriving from the subscriber line voltage first, second, and third comparison voltages, the second comparison voltage being produced by smoothing a voltage between the first and third comparison voltages; and comparing the first and third comparison voltages with the second comparison voltage to produce the pulses at the first and second terminals respectively.

24. A method as claimed in claim 23 wherein the second comparison voltage is produced by integrating a voltage between the first and third comparison voltages with an integration time constant of the order of 200 ms.

25. A method as claimed in claim 23 wherein the step of deriving the first, second, and third comparison voltages from the subscriber line voltage comprises attenuating audio frequency signals.

* * * * *